United States Patent
Hsu et al.

(10) Patent No.: US 6,998,347 B2
(45) Date of Patent: Feb. 14, 2006

(54) METHOD OF REWORKING LAYERS OVER SUBSTRATE

(75) Inventors: Min-Yi Hsu, Changhua (TW); Hsin-Jung Ho, Taipei (TW); Kun-Shin Huang, Keeling (TW); Yi-Nan Chen, Taipei (TW); Kaanlu Tzou, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 89 days.

(21) Appl. No.: 10/605,238

(22) Filed: Sep. 17, 2003

(65) Prior Publication Data

US 2005/0037622 A1    Feb. 17, 2005

(30) Foreign Application Priority Data

Jul. 24, 2003   (TW) .............................. 92120185 A

(51) Int. Cl.
    *H01L 21/302*    (2006.01)
(52) U.S. Cl. ..................... 438/704; 438/690; 438/706
(58) Field of Classification Search ................ 438/636, 438/622, 706, 689, 690, 754, 704
    See application file for complete search history.

(56) References Cited

U.S. PATENT DOCUMENTS

| 6,004,882 A * | 12/1999 | Kim et al. ................... 438/706 |
| 6,753,249 B1 * | 6/2004 | Chen et al. ................. 438/637 |
| 6,798,065 B2 * | 9/2004 | Hsia et al. .................. 257/750 |

* cited by examiner

Primary Examiner—Bradley K. Smith
(74) Attorney, Agent, or Firm—Jianq Chyun IP Office

(57) ABSTRACT

A method of reworking an integrated circuit device is described. A substrate having a dielectric layer, a barrier layer, a conductive layer and an anti-reflective layer formed thereon, is provided. The method of reworking the barrier layer, the conductive layer and the anti-reflective layer comprises removing the anti-reflection layer by performing a dry etching process, removing the conductive layer by performing a wet etching process, and then removing the barrier layer by performing a chemical machine polishing process.

18 Claims, 2 Drawing Sheets

METHOD OF REWORKING LAYERS OVER SUBSTRATE

CROSS REFERENCE TO RELATED APPLICATIONS

This application claims the priority benefit of Taiwan application serial no. 92120185, filed Jul. 24, 2003.

BACKGROUND OF INVENTION

1. Field of the Invention

The present invention relates to a reworking method, and more particularly to a method of reworking integrated circuit devices.

2. Description of the Related Art

The fabrication process of integrated circuit devices is very complex. Usually, integrated circuit devices can be fabricated by hundreds of different process steps. Once requirement of a deposition, etching or lithographic process cannot be achieved during the fabrication process, wafers should be reworked or scraped.

For example, during the process of formation of metal interconnect, usually a barrier layer, a metal layer and an anti-reflective layer are sequentially formed on a substrate having a dielectric layer thereon; then, the definition of the pattern is performed by lithographic and etching processes. During the deposition of the barrier layer, the metal layer, or the anti-reflective layer, if particle contamination or due to other undesirable reason will make the implementation of certain process steps impossible, rework is therefore required. However, when the steps of rework are so complex, time-consuming, high-cost or impossible to achieve reliability requirement, then wafers should be scraped. However, scraping of wafers will increase cost.

SUMMARY OF INVENTION

Accordingly, one object of the present invention is to provide a method of reworking integrated circuit devices, which method is capable of removing the material layer on a substrate requiring reworking unaffecting device reliability.

A further object of the present invention is to provide a method of reworking integrated circuit device, which method is fast, efficient and economical.

In accordance with the above objects, as broadly embodied and described herein, the present invention provides a method of reworking integrated circuit devices. A substrate having a dielectric layer, a barrier layer, a conductive layer and an anti-reflective layer formed thereon, is provided. The method of reworking the barrier layer, the conductive layer and the anti-reflective layer comprises removing the anti-reflection layer by a dry etching process, removing the conductive layer by a wet etching process, and then removing the barrier layer by a chemical machanical polishing process.

According to one embodiment of the present invention, the material of the anti-reflective layer is selected from a group consisting of Ti/TiN, amorphous silicon and Ta/TaN, and the dry etching process for removing the anti-reflective layer is performed using a gas source selected from a group consisting of $Cl_2$, $BCl_3$, hydrocarbon containing halogen and $SF_6$. In addition, when the material of the conductive layer includes Al, Al—Cu alloy or Al—Si—Cu alloy or tungsten, the wet etching process is performed using a solution containing sulfuric acid as an etching solution. When the material of the conductive layer includes Cu, the wet etching process is performed using a solution containing nitric acid as an etching solution.

The method of the present invention does not affect device reliability and can be implemented quickly, efficiently and economically for removing the material layers on the substrate require to be reworked.

DETAILED DESCRIPTION

Figure 1:
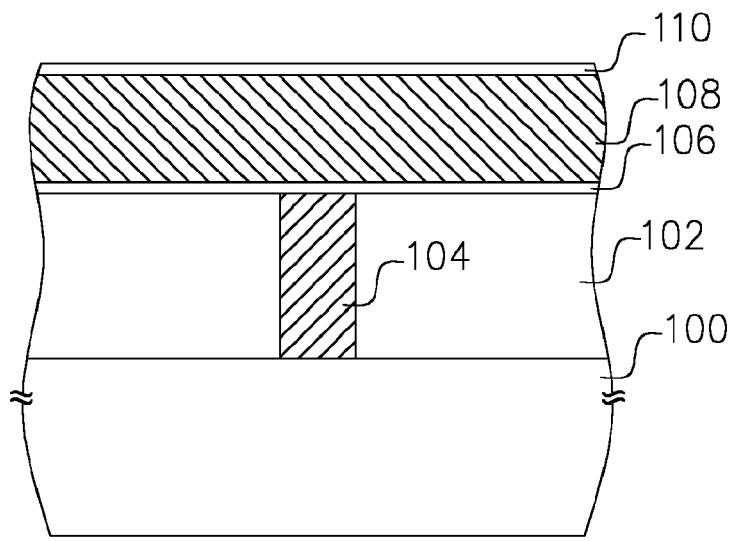
FIGS. 1 to 4 are cross-sectional views showing an exemplary embodiment of reworking integrated circuit devices in accordance with the present invention.
Figure 2:
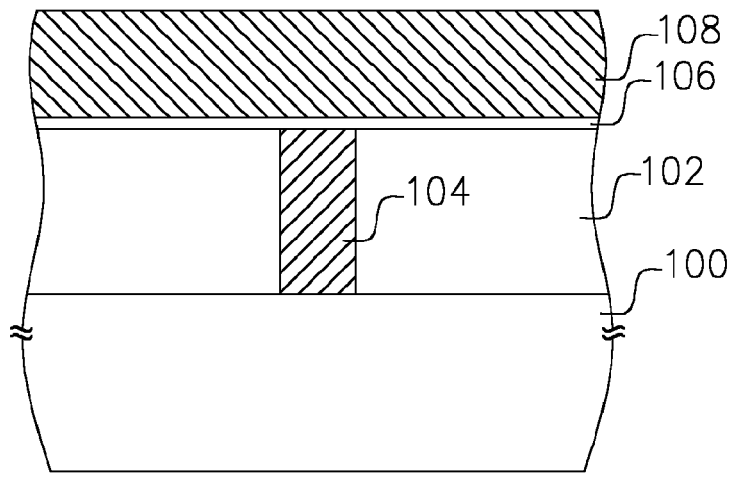
Figure 3:
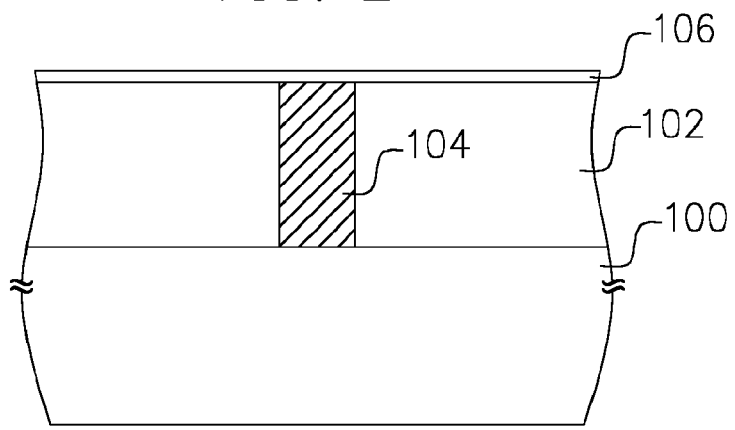
Figure 5:
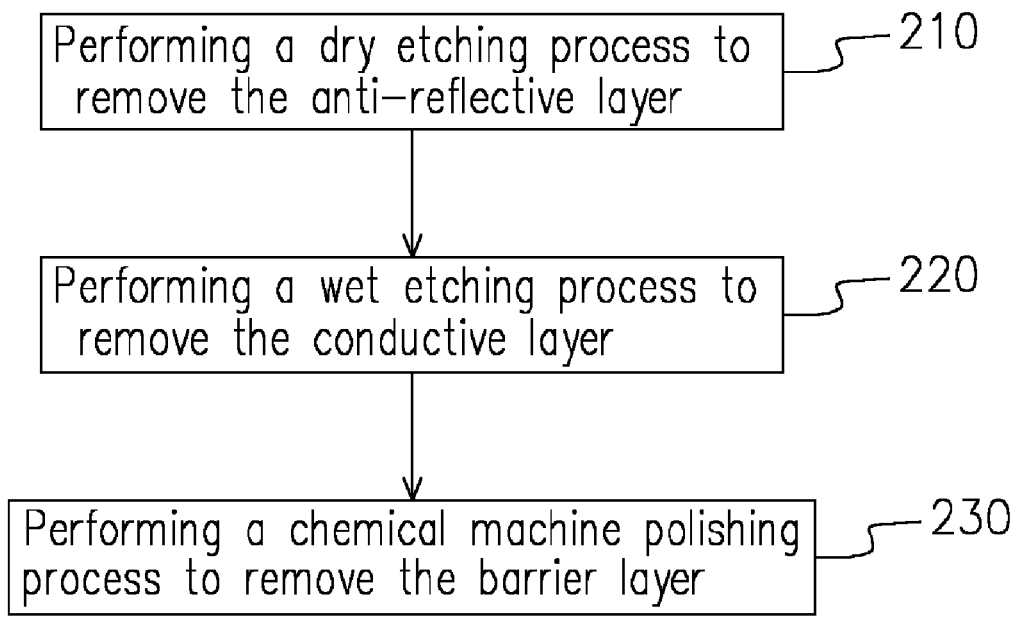
FIG. 5 is a flowchart showing an exemplary embodiment of reworking integrated circuit devices in accordance with the present invention.

Referring to FIG. 1, the method of reworking integrated circuit devices in accordance with the present invention is suitable for reworking semiconductor devices. A substrate 100, having, for example from bottom to top, a dielectric layer 102 with a plug 104 embedded therein, a barrier layer 102, a conductive layer 108 and an anti-reflective layer 110 formed thereon is provided. The materials of the barrier layer 102 and the anti-reflective layer 110 are, for example, Ti/TiN, Ta/TaN, WN or amorphous silicon. The material of the conductive layer 108 includes, for example, Al, Al—Cu alloy, Al—Si—Cu alloy, tungsten, or Cu. The rework method of the present invention will be described in detail as follows: Referring to FIG. 2 and FIG. 5, a dry etching process (step 210) is performed to remove the anti-reflective layer 110. The dry etching process for removing the anti-reflective layer 210 is performed using a gas source selected from a group consisting of $Cl_2$, $BCl_3$, hydrocarbon containing halogen and $SF_6$, wherein the hydrocarbon containing halogen comprises alkane containing fluorine, such as $CHF_3$, or alkane containing chlorine, such as $CCl_4$.

Figure 4:
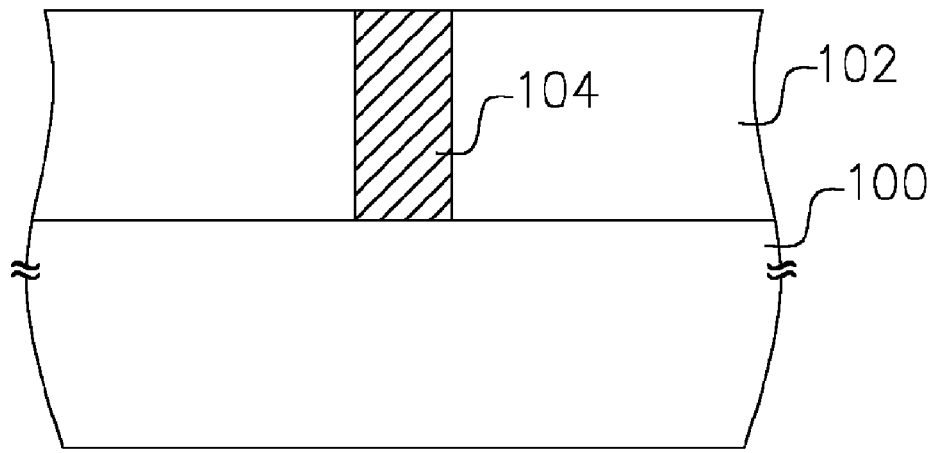

Referring to FIG. 2 and FIG. 4, a wet etching process (step 220) is performed to remove the conductive layer 108. When the material of the conductive layer 108 is Al, Al—Cu alloy, Al—Si—Cu alloy, or tungsten, the wet etching process for removing the conductive layer 108 is performed using an etching solution containing sulfuric acids. When the conductive layer comprises Cu, the wet etching process for removing the conductive layer 108 is performed using an etching solution containing nitric acid.

Then, referring to FIG. 4 and FIG. 5, a chemical mechanical polishing process (step 230) is performed to remove the barrier layer 106. The material of the barrier layer 106 is, for example, Ti/TiN, Ta/TaN, WN or amorphous silicon, wherein the chemical mechanical polishing process is performed using a slurry containing aluminum oxide, hydrogen peroxide, and ammonium hydroxide.

By experimental proof, the reworking method of the present invention actually does not affect device reliability, and can be fast, efficient and economical. Therefore, the method of the present invention is capable of reducing the rework cost, and also avoid scrapping of wafers cost due to failure of reworking.

Although the present invention has been described in terms of an exemplary embodiment, it is not limited thereto. Rather, the appended claims should be constructed broadly to include other variants and embodiments of the invention which may be made by those skilled in the field of this art without departing from the scope and range of equivalents of the invention.

What is claimed is:

1. A method of reworking integrated circuit devices, suitable for reworking a barrier layer, a conductive layer and an anti-reflective layer formed on a dielectric layer, the method comprising:
performing a dry etching process for removing the anti-reflective layer;
performing a wet etching process using an etching solution for removing the conductive layer, wherein
the etching solution contains sulfuric acid when the material of the conductive layer comprises Al, Al—Cu alloy, Al—Si—Cu alloy or tungsten; and
the etching solution containing nitric acid when the conductive layer comprises Cu; and
removing the barrier layer.

2. The method of reworking integrated circuit devices of claim 1, wherein the material of the anti-reflective layer is selected from a group consisting of Ti/TiN, amorphous silicon and Ta/TaN, and the dry etching process for removing the anti-reflective layer is performed using a gas source selected from a group consisting of $Cl_2$, $BCl_3$, hydrocarbon containing halogen and $SF_6$.

3. The method of reworking integrated circuit devices of claim 2, wherein the hydrocarbon containing halogen comprises $CHF_3$ or $CCl_4$.

4. The method of reworking integrated circuit devices of claim 2, wherein the step of removing the barrier layer comprises performing a chemical mechanical polishing process.

5. The method of reworking integrated circuit devices of claim 4, wherein the chemical mechanical polishing process uses a polishing slurry comprising aluminum oxide and hydrogen peroxide.

6. The method of reworking integrated circuit devices of claim 1, wherein the step of removing the barrier layer comprises performing a chemical mechanical polishing process.

7. The method of reworking integrated circuit devices of claim 6, wherein the chemical mechanical polishing process is performed using a polishing slurry comprising aluminum oxide, hydrogen peroxide and ammonium hydroxide.

8. A method of reworking integrated circuit devices, suitable for reworking a barrier layer, a conductive layer and an anti-reflective layer formed on a dielectric layer, the method comprising:
removing the anti-reflective layer;
performing a wet etching process for removing the conductive layer; and
performing a chemical mechanical polishing process using a polishing slurry comprising aluminum oxide, hydrogen peroxide and ammonium hydroxide for removing the barrier layer.

9. The method of reworking integrated circuit devices of claim 8, wherein the material of the conductive layer comprises Al, Al—Cu alloy or Al—Si—Cu alloy, and the wet etching process for removing the conductive layer is performed using an etching solution containing sulfuric acid.

10. The method of reworking integrated circuit devices of claim 8, wherein the material of the conductive layer comprises tungsten, and the wet etching process for removing the conductive layer is performed using an etching solution containing sulfuric acid.

11. The method of reworking integrated circuit devices of claim 8, wherein the conductive layer comprises Cu, and the wet etching process for removing the conductive layer is performed using an etching solution containing nitric acid.

12. The method of reworking integrated circuit devices of claim 8, wherein the step of removing the anti-reflective layer is performed by a dry etching process.

13. The method of reworking integrated circuit devices of claim 12, wherein the material of the anti-reflective layer is selected from a group consisting of Ti/TiN, amorphous silicon and Ta/TaN, and the dry etching process is performed by using a gas source selected from a group consisting of $Cl_2$, $BCl_3$, hydrocarbon containing halogen and $SF_6$.

14. The method of reworking integrated circuit devices of claim 13, wherein the hydrocarbon containing halogen comprises $CHF_3$ or $CCl_4$.

15. A method of reworking integrated circuit devices, suitable for reworking a barrier layer, a conductive layer and an anti-reflective layer formed on a dielectric layer, the method comprising:
removing the anti-reflective layer;
removing the conductive layer; and
performing a chemical mechanical polishing process using a polishing slurry comprising aluminum oxide, hydrogen peroxide and ammonium hydroxide for removing the barrier layer.

16. The method of reworking integrated circuit devices of claim 15, wherein the step of removing the anti-reflective layer is performed by a dry etching process.

17. The method of reworking integrated circuit devices of claim 16, wherein the material of the anti-reflective layer is selected from a group consisting of Ti/TiN, amorphous silicon and Ta/TaN, and the dry etching process is performed by using a gas source selected from a group consisting of $Cl_2$, $BCl_3$, hydrocarbon containing halogen and $SF_6$.

18. The method of reworking integrated circuit devices of claim 17, wherein the hydrocarbon containing halogen comprises $CHF_3$ or $CCl_4$.

* * * * *